United States Patent [19]

Fujimura et al.

[11] Patent Number: 5,391,910
[45] Date of Patent: Feb. 21, 1995

[54] LIGHT RECEIVING DEVICE

[75] Inventors: Yasushi Fujimura; Ichiro Tonai; Hiroshi Okuda, all of Osaka, Japan

[73] Assignee: Sumitomo Electric Industries, Ltd., Japan

[21] Appl. No.: 806,896

[22] Filed: Dec. 16, 1991

[30] Foreign Application Priority Data

Dec. 18, 1990 [JP] Japan .................................. 2-403007

[51] Int. Cl.[6] .................... H01L 27/14; H01L 29/167; H01L 23/48; H01L 29/161
[52] U.S. Cl. ................................... 257/458; 257/461; 257/615; 257/632; 257/656
[58] Field of Search ...................... 357/30, 16, 52, 56, 357/58, 61, 89; 257/458, 459, 461, 466, 615, 626, 632, 649, 656, 657

[56] References Cited

U.S. PATENT DOCUMENTS 4,980,315  12/1990  Einthoven et al. .................. 257/626
5,144,396   9/1992  Sargood ............................... 257/461

OTHER PUBLICATIONS

Y. Akahori, et al, "A Monolithic InP/InGaAs PIN-FET Receiver", Japan Telecommunication Review, vol. 1, No. 4, Nov. 1989, Tokyo JP, pp. 97–102.
Patent Abstracts of Japan, vol. 13, No. 307 (E-787) 13 Jul. 1989 & JPA-1 082,678 (NEC Corp.) 28 Mar. 1989.
Ishimura, et al, "Dark Current and Diffusion Length In InGaAs Photodiodes Grown on GaAs Substrates", Applied Physics Letters, vol. 56, No. 7, 12 Feb. 1990, New York, U.S. pp. 644–646.
Wang et al, "A Front–Side Illuminated InP/GaInAs-/InP p–i–n Photodiode with A–3dB Bandwith in Excess of 18 Ghz", IEEE Transactions on Electron Devices, vol. Ed-34, No. 4 Apr. 1987, New York, U.S., pp. 938–940.

Primary Examiner—Mark V. Prenty
Attorney, Agent, or Firm—Beveridge, DeGrandi, Weilacher & Young

[57] ABSTRACT

A light absorbing layer, and a window layer formed thereon constitutes a first conduction-type semiconductor layer. In a part of this first conduction-type semiconductor layer there is provided a second conduction-type region extending to the light absorbing layer through the window layer. A part of the window layer around the second conduction region is selectively removed. Consequently even when light intended to enter a light detecting region is incident outside of the light detecting region, most of the carriers generated there are recombined at a surface level of the light absorbing layer before diffusing in a depletion layer. This light detecting device therefor does not substantially detect sensitivity to light incident outside the light detecting region.

12 Claims, 6 Drawing Sheets

LIGHT RECEIVING DEVICE

BACKGROUND OF THE INVENTION

1. Field of the Invention

This invention relates to a light receiving device for use in devices for monitoring an output of semiconductor laser, receiver devices used in optical communication systems, etc.

2. Related Background Art

Figure 1A:
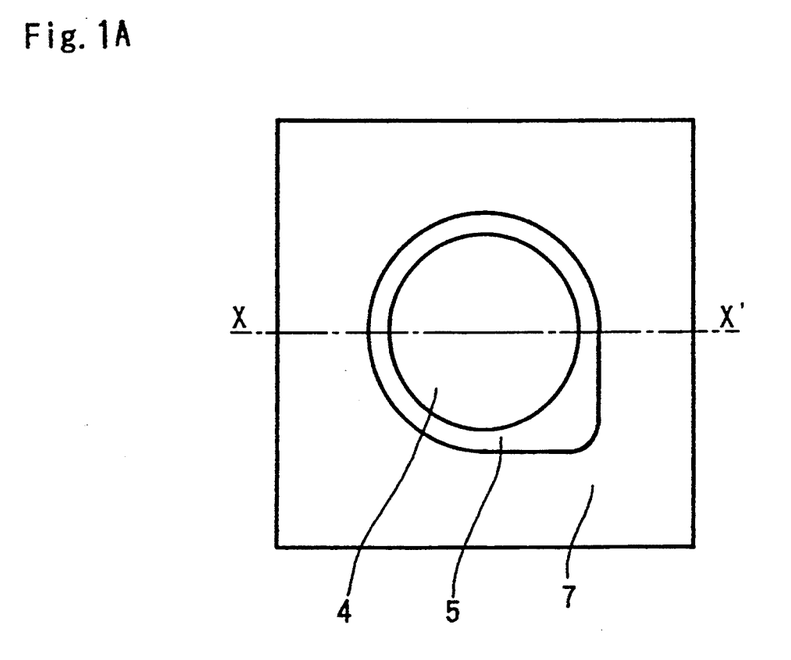
FIGS. 1A and 1B are respectively views of the structure of a conventional light receiving device.
Figure 1B:
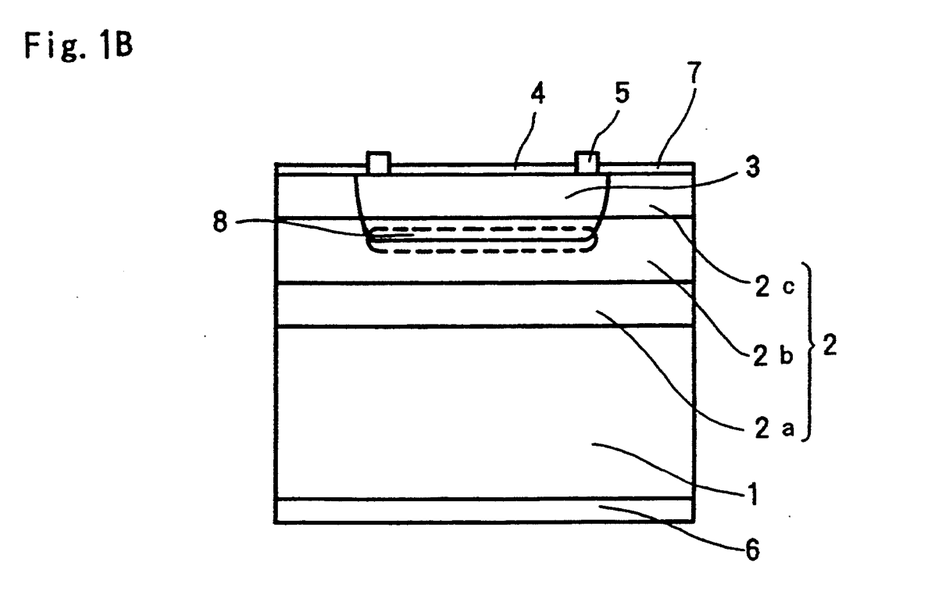

FIG. 1A shows a top view of a conventional light receiving device, and FIG. 1B shows a sectional view along the line X-X' thereof.

A buffer layer 2a, a light absorbing layer 2b, and a window layer 2c are sequentially formed, in this stated order as a first conduction-type lightly doped semiconductor layer 2 on a surface of a first conduction-type highly doped semiconductor substrate 1 having a first conduction-type electrode 6 on the backside. At an element forming region (a region where a PIN photodiode structure to be formed) which is a part of the first conduction-type semiconductor layer 2, there is formed a second conduction-type region 3 on which impurities are selectively diffused. An anti-reflection coating 4, a second conduction-type electrode 5, and a device protection film (i.e. passivation film) 7 are formed on a surface of the second conduction-type region 3.

When a reverse bias is applied to the light receiving device of the above-described structure, a depletion layer is expanded in a pn junction portion of the first conduction-type semiconductor layer 2. In this state, when light pulses or the like are incident on a neighborhood of the pn junction portion through the window layer 2c, carriers are generated in this light detecting region 8. The generated carriers are separated and accelerated by an electric field in this depletion layer to be output as a photoelectric current through the electrodes 5 and 6.

Figure 2:
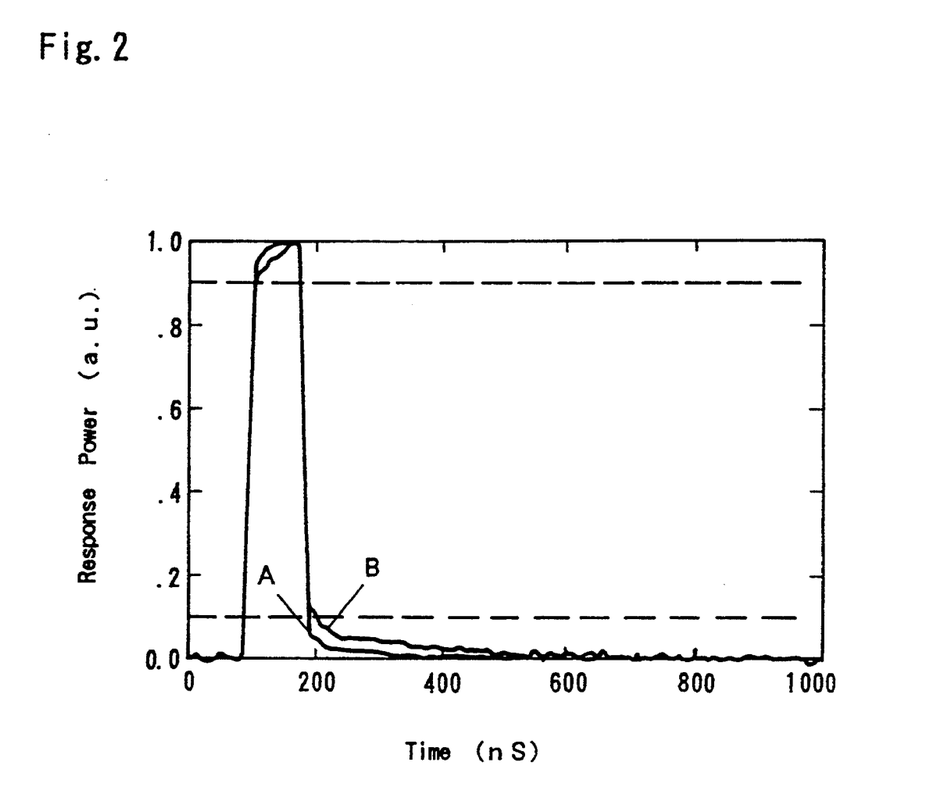
FIG. 2 is a view of light pulse response characteristics of the light receiving device of FIGS. 1A and 1B.

In the light receiving device of FIGS. 1A and 1B, carriers generated outside the light detecting region 8 are concurrently detected. In other words, even these carriers are output as a photoelectric current because carriers generated by light pulses entering outside the element forming region are diffused in the device forming region due to a density gradient. In this case, the transfer of the carriers due to the diffusion is so slow that the response waveforms of the light pulses have a tail at the end of waveform as shown on curve B in FIG. 2.

It is possible to solve this problem by the perfect control of the incidence position of light pulses or others. Practically, however, it is difficult to cause light pulses to be incident on the inside of the element forming region. Especially in optical communication applications for detecting optical signals from optical fibers, etc., the area of the element forming region, i.e., the light detecting region 8, is made small for the purpose of the high-speed response of the light detecting device. As a result, the current component attributed to the diffusion of carriers generated outside the light detecting region 8 is increased, and the response speed of the light detecting device is reduced. This problem occurs similarly with the light receiving device used in controlling drive-currents for semiconductor lasers.

SUMMARY OF THE INVENTION

It is one object of this invention to provide a light detecting device which is insensitive to the light incident outside a predetermined light detecting region, and enables high-speed response.

It is further object of the present invention to provide a light receiving device comprising a light absorbing layer made of a semiconductor of a first conduction type; a semiconductor layer formed on the light absorbing layer and made of a semiconductor of the first conduction type, a window layer being laid on the semiconductor layer, the window layer having a wider forbidden band and a second conduction type semiconductor region formed in an element forming region and extended to the light absorbing layer through the window layer, a part of the window layer being removed in a peripheral area surrounding the element forming region, the light absorbing layer being exposed in the peripheral area, a device protection film being deposited in the element forming region and a surface in the peripheral area of the semiconductor layer.

The window layer allows signal light to be incident on a light absorbing layer without absorbing signal light having wavelengths longer than a predetermined wavelength, and carriers of holes/electrons generates in the light absorbing layer when a signal light is incident there into. Further an element forming region corresponds to a predetermined region of the light receiving device into which the signal light to be output as an electric signal should be incident.

According to the light receiving device according to this invention, a part of a window layer around the element forming region is removed. Therefore a surface of the part of the light absorbing layer outside the element forming region, i.e., the light detecting region, is not coated with the window layer, which suppresses the generation of a surface state. That is, the surface of the part of the light absorbing layer outside the element forming region has high surface state density. Consequently even when light to be incident on the light detecting region is incident on the part of the light absorbing layer outside the light detecting region, many of the carriers generated in the part of the light absorbing layer outside the light detecting are recombined through a surface state of the surface of the light absorbing layer. Consequently this light detecting device does not have substantial sensitivity to light incident outside a predetermined light detecting region.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 3A:
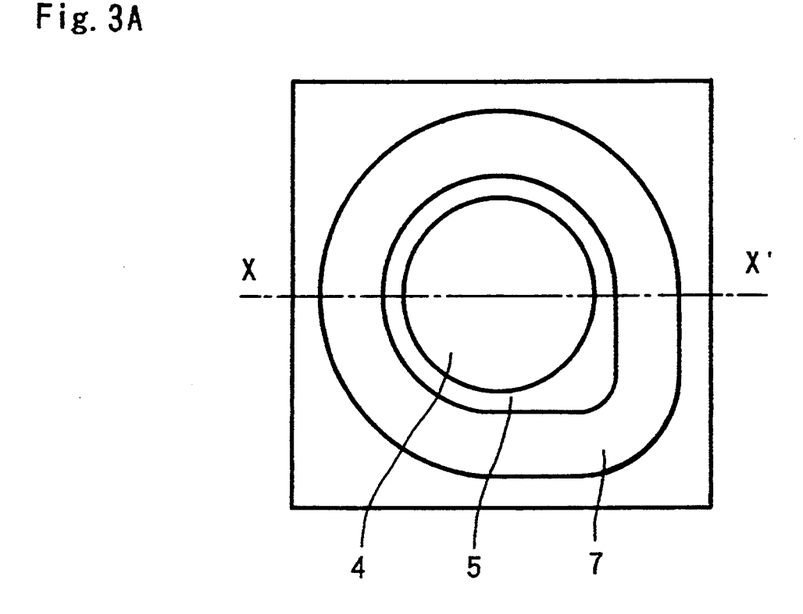
FIG. 3A and 3B are respectively views of the structure of the light receiving device according to a first embodiment of this invention.
Figure 3B:
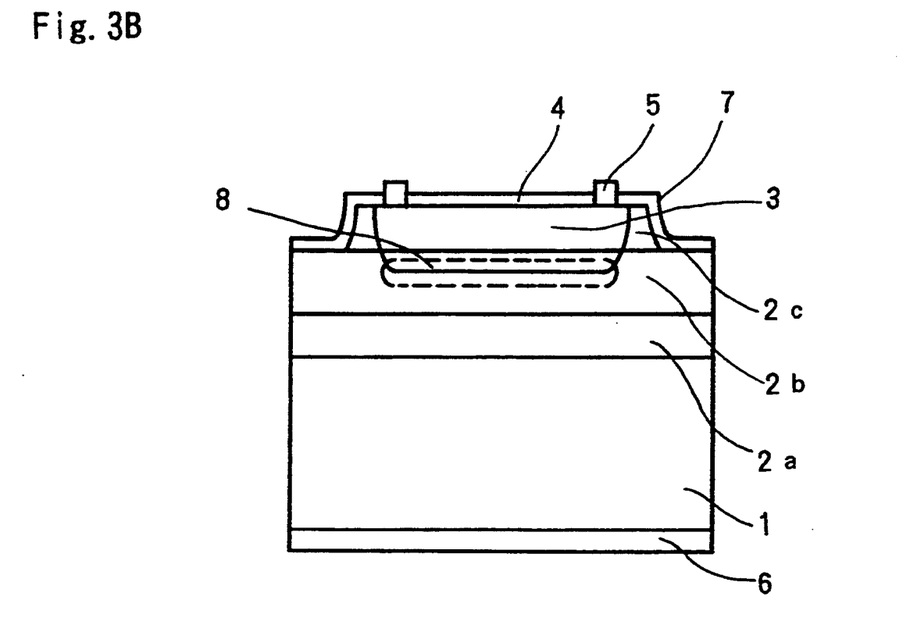

FIG. 3A is a top view of the PIN photo-diode of a first embodiment according to the present invention, and FIG. 3B is a sectional view of the PIN photo-diode of the first embodiment along the line X-X'. As shown in FIG. 3B, on a first conduction-type n+ InP substrate 1 ($n=2\times10^{18}$ cm$^{-3}$), a non-doped InP buffer layer 2a ($n=2\times10^{15}$ cm$^{-3}$, thickness 2 $\mu$m) of a first conduction type, a non-doped InGaAs light absorbing layer 2b ($n=2\times10^{15}$ cm$^{-3}$, thickness: 3.5 $\mu$m) and a non-doped InP window layer 2c ($n=2\times10^{15}$ cm$^{-3}$, thickness: 2 $\mu$m) are grown in this stated order. The InP constituting the window layer has a wider forbidden band than that of the InGaAs of the light absorbing layer 2b and allows signal light to be incident on the light absorbing layer 2b without absorbing signal light having wavelengths longer than a predetermined wavelength. A p-type-region 3 is formed by selectively diffusing Zn by sealed tube process. This region has a diameter of about 300 $\mu$m and makes up a PIN photo-diode together with the light absorbing layer 2b, the buffer layer 2a and the substrate 1.

The non-doped InP window layer 2c is removed, remaining the p-type region 3 and the annular window layer 2c (width: 20 $\mu$m) around at least the p-type region 3. This partial removal of the window layer 2c is conducted using a selective etchant, (e.g., HCl:H$_2$O=1:2) which can remove only the window layer, remaining the light absorbing layer. Such selective etchant has such a sufficiently higher etching rate for the light absorbing layer than for the window layer 2c so that control can be well performed to expose the light absorbing layer. On the surface of the window layer 2c provided in the p-type-region 3, there is provided a p-type electrode 5, and on the backside of the substrate 1, there is provided a n-type electrode 6. Carriers are output from these electrodes in response to light signals. An anti-reflection coating 4 is formed on the surface of the window layer 2c in the p-type electrode 5 for preventing the generation of stray light. A device protection film 7 of silicon nitride is formed on the window layer 2c outer of the p-type electrode 5 and the exposed light absorbing layer 2b. Materials of the device protection film 7 are selected from those which do not tend to generate surface states at the interface with the window layer 2c but to generate surface states at the interface with the light absorbing layer 2b. The surface state density on the interface with the window layer 2c is smaller than that on the interface with the light absorbing layer 2b. SiN, SiON, SiO$_2$, etc. are selected suitably in connection with materials of the light absorbing layer 2b and the window layer 2c.

The operation of the PIN photo-diode of FIGS. 3A and 3B will be explained below. A suitable reverse bias is applied between the p-type-electrode and the n-type electrode 6. As a result, a depletion layer formed in the pn junction portion between the p-type region 3 of the second conduction type and the light absorbing layer 2b of the first conduction type widens, and the widened depletion region functions as the light detecting region 8. The case that signal light is incident on the PIN photo-diode in this state will be considered. The signal light which has entered from above the PIN photo-diode is incident on the light detecting region 8 through the anti-reflection film 4, etc. Carriers of electrons/holes generated by this incident light are separated due to an electric field of a high intensity into the p-type region 3 and the light absorbing layer 2b, and accelerated. Here the surface state density in a surface of the window layer 2c, i.e., of the p-type region 3 is very low and therefore little generated carriers are trapped in the surface. Consequently an photoelectric current is immediately output efficiently. Then the case that stray light enters the portion of the PIN photo-diode except the light detecting region 8 will be considered. When stray light enters the part of the light absorbing layer 2b around the p-type region 3, since the surface state density on the surface of the light receiving layer 2b is high, most of the carriers generated here are recombined in the surface of the light absorbing layer 2b due to a surface state generated between the light absorbing layer 2b and the device protecting film 7 to vanish. Consequently the diffusion current component due to carriers generated by the stray light is decreased with the result that the decrease of the response speed resulting from this diffusion current component is improved. In this point, this invention is different from the art described in "TRANSACTIONS ON ELECTRON DEVICE", Vol. ED-34, No. 4, April, 1987, P. 38", "ELECTRONICS LETTERS, 4th July, 1985, Vol. 21, No. 14, P. 593, and others. That is, in these references, all the light absorbing layer around the light detecting region is removed so that the light absorbing layer does not react to the light incident outside the light detecting region. In contrast to this, in the light receiving device according to this invention, the light detecting layer 2b except a part corresponding to the light detecting region is remains to generate a surface state in an interface thereof with respect to the device protecting film 7 so as to trap the carriers generated here.

Figure 4:
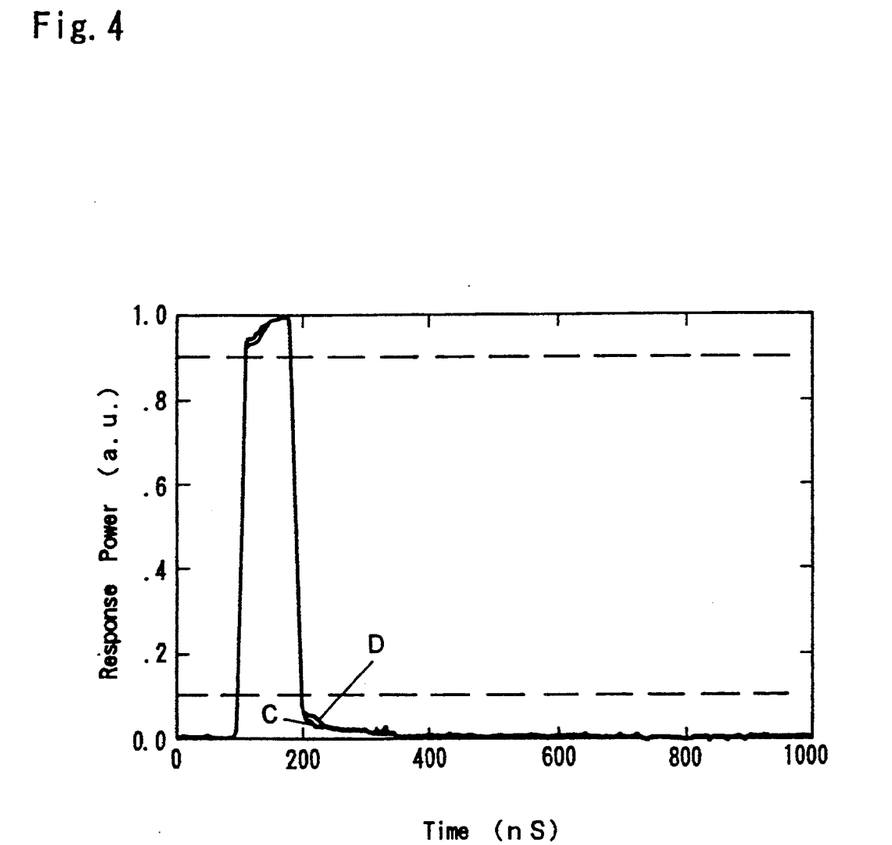
FIG. 4 is a view of the light pulse response characteristics of the light receiving device of FIGS. 3A and 3B.

FIG. 4 is a view of the light pulse response characteristics of the PIN photo-diode of FIGS. 3A and 3B. Time is shown on the horizontal axis, and outputs of the PIN photo-diode are shown on the vertical axis. The light pulse response characteristics are those of the case that signal light is incident only inside the light detecting region 8, as shown in a curve C and the case that signal lights incident outside the light detecting region 8 as shown in a curve D, as well. As seen in FIG. 4, there is no substantial difference between both cases.

As seen from the above, in the PIN photo-diode according to this embodiment, the decrease of a response speed resulting from the signal light, stray light, etc. incident outside light the detecting region 8 can be prevented. Owing to this, the area of the light detecting region 8 of the light detecting device used in optical communication applications using optical fibers can be reduced. Consequently the sensitivity and response of the light receiving device can be improved, and its integration can be enhanced. In using this receiving device in applications of controlling the output beam output of semiconductor lasers, the control of the output beam of the semiconductor lasers can be improved.

That is, even when a feedback beam obtained from the rear end surface of a semiconductor laser is incident outside the light receiving region 8 of the light receiving device, no diffusion current component, which adversely affects the feedback control, is generated, and consequently the drive current of the semiconductor laser can be accurately feedback controlled. Furthermore, in the PIN photo-diode according to this embodiment, the light detecting layer 2b is not removed, but the window layer 2c is removed, and resultantly the steps formed between the p-type region 3 and other regions are small. Consequently a structure in which poor lithography, defective protection film, etc. do not easily take place is provided.

It is preferable that the thickness of the light absorbing layer 2b is 1 to 7 μm for the improvement of the absorbing efficiency of the incident light but is not necessarily limited to this range. The width of the annular window layer 2c around the p-type region 3 is 2 to 30 μm for the response speed characteristic, etc. but is not necessarily limited to this range. But it has been confirmed that as the thickness of the annular window layer 2c around the p-type region is smaller in this range, the reduction of the response speed is suppressed.

Alternatively, the light absorbing layer in the peripheral area can be made to extend to substantially the same depth as that of the light detecting region formed in the vicinity of the interface of the pn junction in the light absorbing layer of the element forming region.

The PIN photo-diode according to a second embodiment of this invention will be explained below.

Figure 5A:
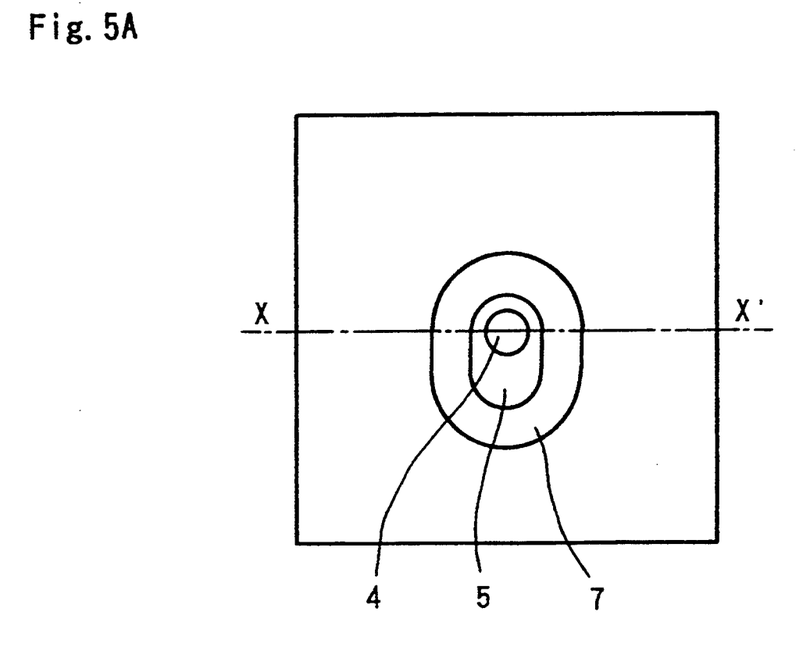
FIGS. 5A and 5B are respectively views of the structure of the light receiving device according to a second embodiment of this invention.
Figure 5B:
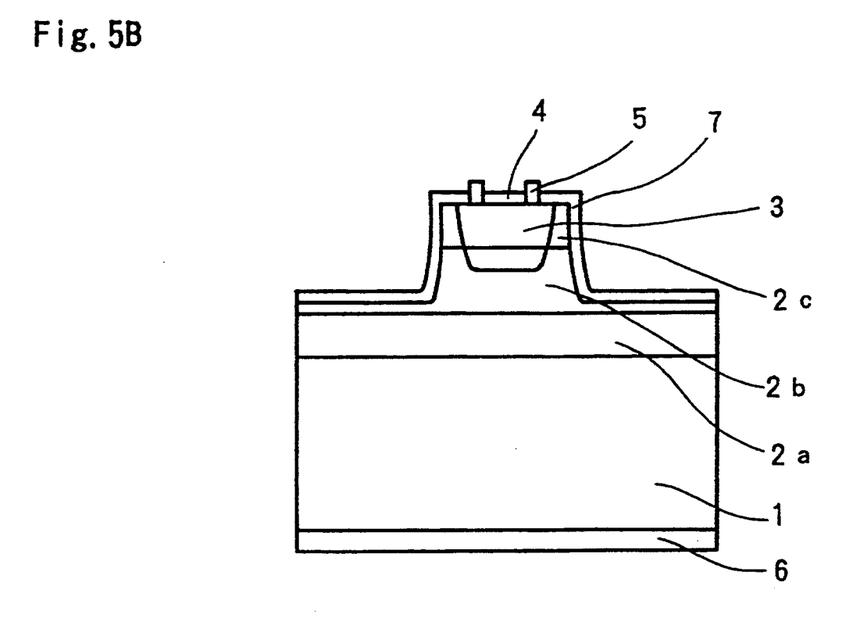

In the PIN photo-diode according to the second embodiment, not only the part of the window layer around the p-type region 3, but also the part of the light absorbing layer below the part of the window layer is removed.

FIG. 5A is a top view of the PIN photo-diode of the second embodiment, and FIG. 5B is a sectional view of the second embodiment along the line X–X'. As shown in FIG. 5B, on n+ InP substrate 1 of the first conduction type, a non-doped InP buffer layer 2a of the first conduction-type, a non-doped InGaAs light absorbing layer 2b, and a non-doped InP window layer 2c are grown in this stated order. The substrate 1, the buffer layer 2a, the light absorbing layer 2b and the window layer 2c are the same as in the first embodiment, and therefore their densities, etc. are not explained here. A p-type region 3 of the second conduction-type is formed, as in the first embodiment, by selectively diffusing Zn, and its diameter is about 50 l μm.

This p-type region 3, and the light absorbing layer 2b, the buffer layer 2a and the substrate 1 constitute a PIN photo-diode structure.

The non-doped InP window layer 2c is removed except a part corresponding to the p-type region 3 and a 10 μm-width part around the p-type region 3. In this embodiment the window layer 2c, and also a part of the light absorbing layer 2b are removed as shown in FIG. 5B. In this case, sulfuric acid-based (e.g., $H_2SO_4$:$H_2O_2$:$H_2O$ = 3:1:1), HBr-based and broinine methanol-based etchants, which are not selective between the window layer 2c and the light absorbing layer 2b, may be used. Resultantly the thickness of the light absorbing layer 2b left unremoved is about 1 μm. A p-type electrode 5 on the surface of the substrate 1 and an n-type electrode 6 on the backside of the substrate 1, an anti-reflection coating 4 on the p-type-region 3, and a device protection film 7 are formed in the same manner as in the first embodiment.

The operation of the PIN photo-diode according to the second embodiment is the same as that of the first embodiment.

A suitable reverse bias voltage is applied between the p-type electrode 5 and the n-type electrode 6 to thereby widen a depletion layer which is a light detecting region 8. The operation of the PIN photo-diode when signal light enters the light detecting region 8, is the same as in the first embodiment, and therefore is not explained here. On the other hand, when stray light is incident on the part except the light detecting region 8 of the PIN photo-diode, most of the carriers generated here are recombined on a surface state of the light absorbing layer 2b. Consequently the diffusion current component resulting from carriers generated by stray light is decreased, and the decrease of the response speed due to such diffusion current component is lowered.

The PIN photo-diode according to a third embodiment of this invention will be explained below.

Figure 6A:
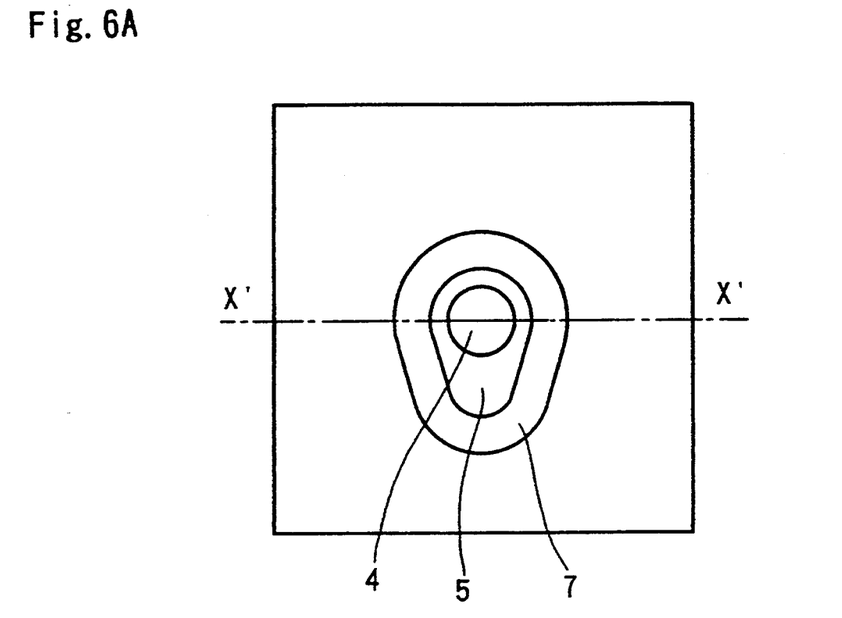
FIGS. 6A and 6B are respectively views of the structure of the light receiving device according to a third embodiment of this invention.
Figure 6B:
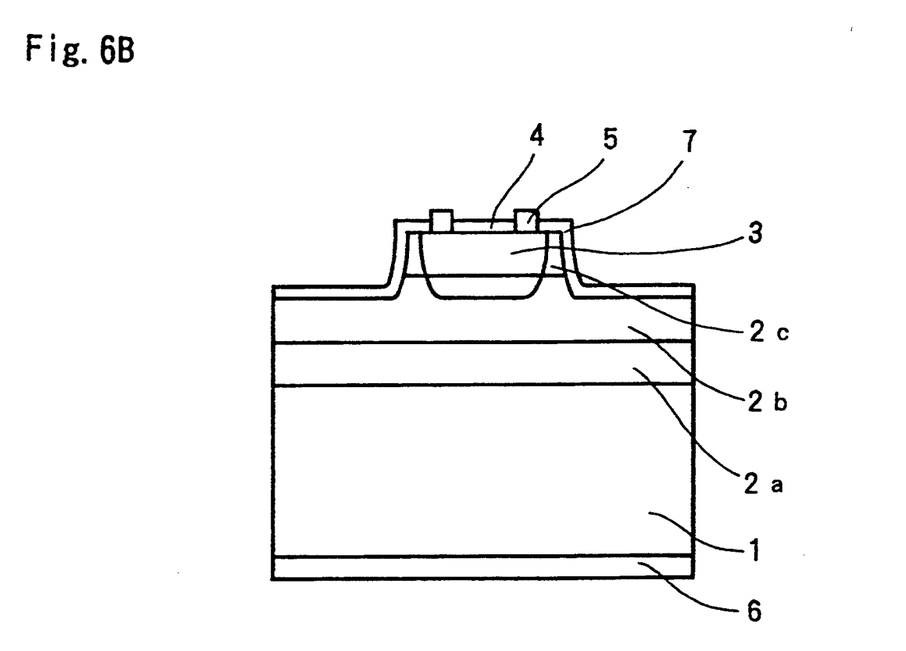

In the PIN photo-diode according to the third embodiment as well, not only a part of a window layer around a p-type region 3, but also a part of a light absorbing layer therebelow are removed.

FIG. 6A is a top view of the PIN photo-diode according to the third embodiment, and FIG. 6B is a sectional view of the third embodiment along the line X–X'. As shown in FIG. 6B, on a first conduction-type substrate 1, a buffer layer 2a of a first conduction type, a light absorbing layer 2b and a window layer 2c are grown in this stated order. The compositions, carrier concentrations, thicknesses, etc. of the substrate 1, the buffer layer 2a and the light absorbing layer 2b and the window layer are the same as in the first embodiment of FIGS. 3A and 3B, and therefore their explanation is not repeated. A p-type region 3 of a second conduction type is formed, as in the first embodiment, is formed by selective diffusion of Zn and has a diameter of about 100 μm.

The window layer 2c is removed except the part corresponding to the p-type region 3 and a 15 μm width-part around the p-type region 3. The partial removal of the window layer 2c is conducted by reactive ion etching, which does not tend to cause side etching. Concurrently with the partial removal of the window layer 2c, the surface layer of the light absorbing layer 2b is partially as shown in FIG. 6B removed. A p-type electrode 5 on the surface of the substrate 1, an n-type electrode 6 on the backside of the substrate 1, an anti-reflection coating 4 on the p-region 3, and a device protecting film 7 are formed in the same manner as in the first embodiment.

The operation of the PIN photo-diode according to the third embodiment is the same as in the first embodiment.

A suitable revere bias voltage is applied between the p-type electrode 5 and the n-type electrode 6 to thereby to widen the depletion layer, which is the light detecting region 8. When stray light is incident on the part of the PIN photo-diode except the light detecting region 8, most of the carriers generated there are recombined in a surface state of the light absorbing layer 2b to vanish. Consequently the diffusion current component due to the carriers generated by stray light is decreased, and the decrease in the response speed due to this diffusion current component is lowered.

The semiconductor materials and their dimensions have been described above merely for example, and may differ in accordance with applications of the light receiving device, and their wavelengths, etc. For example, as the semiconductor materials, not only compound semiconductors, such as GaAs, InGaAsP, AlGaAs, CdTe, HgCdTe, InSb, etc., but also Si, Ge, etc. can be used. As the dopant, Be, Cd, etc. may be used. The ion diffusion may be conducted by ion implantation or other techniques.

As described above, according to the light detecting device according to this invention, because the part of the window layer around the light detecting region is removed, the unnecessary carriers generated in the part except the light detecting region by stray light incident on the part are recombined on the surface of the light absorbing layer having a high surface state density and a high surface recombining speed and vanish. The advantages of this light receiving device in comparison with the usual mesa PDs are that, because the window layer and a part of the light absorbing layer are removed, only small steps are formed between the light detecting region and other regions, and unsatisfactory lithography, defects of the device protection film, etc. do not easily take place, and that the rare defects of the device protection film results in higher reliability than mesa PDs.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A light receiving device comprising:
   a semiconductor substrate of a first conductivity type semiconductor, the substrate having a front side and a back side; and
   a light detection structure located on the front side of the substrate, the light detection structure including
   a light absorbing layer made of a semiconductor of the first conductivity type;
   a window layer provided on the light absorbing layer, the window layer having a wider forbidden band than the absorbing layer and being formed of a first conductivity type semiconductor;
   a second conductivity type semiconductor region provided in the window layer and extending into the light absorbing layer;
   the window layer surrounding the second conductivity type semiconductor region,
   a second conductivity type electrode contacting with the second conductivity type semiconductor region; and
   a first conductivity type electrode provided on the back side of the first conductivity type substrate;
   a device protection film which covers a top surface and a side peripheral portion of the window layer, the device protection film covering over and contacting a top surface of the light absorbing layer, about an outer portion of the window layer.

2. A light receiving device according to claim 1, wherein an interface of the device protection film at a peripheral portion thereof and the light absorbing layer has a relatively high surface state density and an interface of the device protection film and the window layer has a relatively low surface state density.

3. A light receiving device comprising:
   a light absorbing layer made of a first conductivity type semiconductor;
   a window layer provided on the light absorbing layer and being formed by a first conductivity type semiconductor, the window layer having a wider forbidden band than that of the light absorbing layer;
   a second conductivity type semiconductor region provided in the window layer and extending into the light absorbing layer;
   the window layer being formed on the light absorbing layer so as to surround the second conductivity type semiconductor region; and
   a device protection film for covering a top surface and side peripheral area of the window layer, the device protection film covering over and contacting a top surface of the light absorbing layer about an outer portion of the window layer, the light absorbing layer having a thin peripheral area corresponding to the peripheral area of the device protection film.

4. A light receiving device according to claim 3, wherein the light absorbing layer in the peripheral area extends to a position deeper than that of a light detecting region formed in the vicinity of an interface of a pn junction in the light absorbing layer.

5. A light receiving device according to claim 1, wherein the light absorbing layer is formed on a buffer layer formed on the substrate and made of the first conductivity type semiconductor.

6. A light receiving device according to claim 1, wherein the window layer is made of InP and the light absorbing layer is made of InGaAs.

7. A light receiving device comprising:
   a light absorbing layer made of a first conductivity type semiconductor;
   a window layer provided on the light absorbing layer and being formed by a first conductivity type semiconductor, the window layer having a wider forbidden band than that of the light absorbing layer;
   a second conductivity type semiconductor region provided in the window layer and extending into the light absorbing layer;
   the window layer being formed on the light absorbing layer so as to surround the second conductivity type semiconductor region; and
   a device protection film for covering a top surface and side peripheral area of the window layer, the device protection film covering over and contacting a top surface of the light absorbing layer about an outer portion of the window layer, the device protection film being formed of one of $SiO_2$, SiN and SiON.

8. A light receiving device according to claim 3, wherein the light absorbing layer is formed on a buffer layer formed on a substrate and made of the first conductivity type semiconductor.

9. A light receiving device according to claim 3, wherein the window layer is made of InP and the light absorbing layer is made of InGaAs.

10. A light receiving device according to claim 3, wherein the device protection film is made of one of $SiO_2$, SiN and SiON.

11. A light receiving device according to claim 8, wherein the substrate is made of the first conductivity type semiconductor in which there is more impurity doping than that of the first type portion in the buffer layer, the light absorbing layer and the window layer.

12. A light receiving device comprising;

a light absorbing layer made of a first conductivity type semiconductor;

a window layer provided on the light absorbing layer and being formed of a first conductivity type semiconductor, the window layer having a wider forbidden band than that of the light absorbing layer;

a second conductivity type semiconductor region provided in the window layer and extending into the light absorbing layer;

the window layer being provided on the light absorbing layer so as to surround the second conductivity type semiconductor region; and a device protection film which covers a top surface and a side peripheral portion of the window layer, the device protection film covering over and contacting a top surface of the light absorbing layer about an outer portion of the window layer.

* * * * *